(12) United States Patent
Son et al.

(10) Patent No.: US 12,230,571 B2
(45) Date of Patent: Feb. 18, 2025

(54) INTEGRATED CIRCUIT DEVICES INCLUDING A POWER RAIL AND METHODS OF FORMING THE SAME

(71) Applicant: Samsung Electronics Co., Ltd., Suwon-si (KR)

(72) Inventors: Gilhwan Son, Clifton Park, NY (US); Hoonseok Seo, Niskayuna, NY (US); Saehan Park, Clifton Park, NY (US); Byounghak Hong, Albany, NY (US); Kang-Ill Seo, Springfield, VA (US)

(73) Assignee: Samsung Electronics Co., Ltd., Suwon-si (KR)

( * ) Notice: Subject to any disclaimer, the term of this patent is extended or adjusted under 35 U.S.C. 154(b) by 421 days.

(21) Appl. No.: 17/576,007

(22) Filed: Jan. 14, 2022

(65) Prior Publication Data
US 2023/0163073 A1    May 25, 2023

Related U.S. Application Data

(60) Provisional application No. 63/282,411, filed on Nov. 23, 2021.

(51) Int. Cl.
| | |
|---|---|
| H01L 23/528 | (2006.01) |
| H01L 21/74 | (2006.01) |
| H01L 21/768 | (2006.01) |
| H01L 21/8234 | (2006.01) |
| H01L 23/48 | (2006.01) |
| H01L 23/485 | (2006.01) |
| H01L 23/535 | (2006.01) |
| H01L 27/088 | (2006.01) |

(52) U.S. Cl.
CPC .... *H01L 23/5286* (2013.01); *H01L 21/76898* (2013.01); *H01L 23/535* (2013.01)

(58) Field of Classification Search
CPC .......... H01L 23/5286; H01L 21/76898; H01L 23/535; H01L 21/76895; H01L 23/481; H01L 21/743; H01L 23/485; H01L 21/823475; H01L 21/76877; H01L 27/088
See application file for complete search history.

(56) References Cited

U.S. PATENT DOCUMENTS

| | | | |
|---|---|---|---|
| 10,985,057 B2 | 4/2021 | Jourdain et al. | |
| 10,985,064 B2 | 4/2021 | Zhang et al. | |
| 11,081,559 B1 | 8/2021 | Liang et al. | |
| 2018/0145030 A1* | 5/2018 | Beyne | H01L 21/76251 |
| 2020/0373331 A1 | 11/2020 | Kim et al. | |
| 2021/0028112 A1* | 1/2021 | Kim | H01L 29/41791 |
| 2021/0074823 A1 | 3/2021 | Glass et al. | |
| 2021/0305381 A1 | 9/2021 | Chiang et al. | |
| 2021/0305428 A1 | 9/2021 | Ju et al. | |
| 2021/0375723 A1* | 12/2021 | Lin | H01L 23/5283 |

\* cited by examiner

*Primary Examiner* — Herve-Louis Y Assouman
(74) *Attorney, Agent, or Firm* — Myers Bigel, P.A.

(57) ABSTRACT

Methods of forming an integrated circuit devices may include forming a transistor on a first surface of a substrate. The transistor may include an active region, a source/drain region contacting the active region and a gate electrode on the active region. The methods may also include forming a conductive wire that is electrically connected to the source/drain region, forming a trench extending through the substrate by etching a second surface of the substrate, which is opposite the first surface of the substrate, and forming a power rail in the trench. The power rail is electrically connected to conductive wire.

14 Claims, 24 Drawing Sheets

INTEGRATED CIRCUIT DEVICES INCLUDING A POWER RAIL AND METHODS OF FORMING THE SAME

CROSS-REFERENCE TO RELATED APPLICATION

This application claims priority to U.S. Provisional Application Ser. No. 63/282,411, entitled BACKSIDE POWER DISTRIBUTION NETWORK STRUCTURES WITH A BURIED POWER RAIL AND METHODS OF FORMING THE SAME, filed in the USPTO on Nov. 23, 2021, the disclosure of which is hereby incorporated by reference herein in its entirety.

FIELD

The present disclosure generally relates to the field of electronics and, more particularly, to integrated circuit devices including a power rail.

BACKGROUND

Various structures of an integrated circuit device and methods of forming the same have been proposed to increase the integration density thereof. Specifically, an integrated circuit device including elements formed in a substrate or on a backside of the substrate has been proposed to simplify the middle-of-line (MOL) portion or the back-end-of-line (BEOL) portion of device fabrication.

SUMMARY

According to some embodiments of the present invention, methods of forming an integrated circuit devices may include forming a transistor on a first surface of a substrate. The transistor may include an active region, a source/drain region contacting the active region and a gate electrode on the active region. The methods may also include forming a conductive wire that is electrically connected to the source/drain region, forming a trench extending through the substrate by etching a second surface of the substrate, which is opposite the first surface of the substrate, and forming a power rail in the trench. The power rail is electrically connected to conductive wire.

According to some embodiments of the present invention, methods of forming an integrated circuit devices may include forming a transistor on a first surface of a substrate. The transistor may include an active region, a source/drain region contacting the active region and a gate electrode on the active region. The methods may also include forming an etch stop layer contacting the first surface of the substrate, forming an insulating layer on the etch stop layer, forming an opening that extends through the insulating layer and the etch stop layer and exposes the substrate, forming a conductive plug in the opening, forming a conductive wire that is electrically connected to the conductive plug and the source/drain region, forming a trench that extends through the substrate by etching a second surface of the substrate and exposing the conductive plug, and forming a power rail in the trench. The power rail may contact the conductive plug. The second surface of the substrate is opposite the first surface of the substrate.

According to some embodiments of the present invention, integrated circuit devices may include a transistor on a substrate. The transistor may include an active region, a source/drain region contacting the active region and a gate electrode on the active region. The integrated circuit devices may also include a conductive wire that is electrically connected to the source/drain region, and a power rail that is in the substrate and is electrically connected to the conductive wire. The the substrate includes a first surface and a second surface that is opposite the first surface, and the gate electrode may be closer to the first surface than the second surface. Opposing side surfaces of the power rail may be slanted with respect to the first surface of the substrate, and a distance between the opposing side surfaces of the power rail may increase along a direction from the first surface to the second surface of the substrate.

DETAILED DESCRIPTION

There may be several issues when a power rail is formed in a substrate before transistors are formed. For example, metal elements of a power rail may contaminate elements (e.g., a gate insulator) of transistors subsequently formed, or a resistance of a power rail may increase due to high temperature processes of the front-end-of-line (FEOL) portion of device fabrication.

According to some embodiments of the present invention, a power rail may be formed after the BEOL portion of device fabrication. Therefore, metal elements of a power rail may not contaminate transistors, and the power rail may not go through high temperature processes of the FEOL portion of device fabrication.

Figure 1:
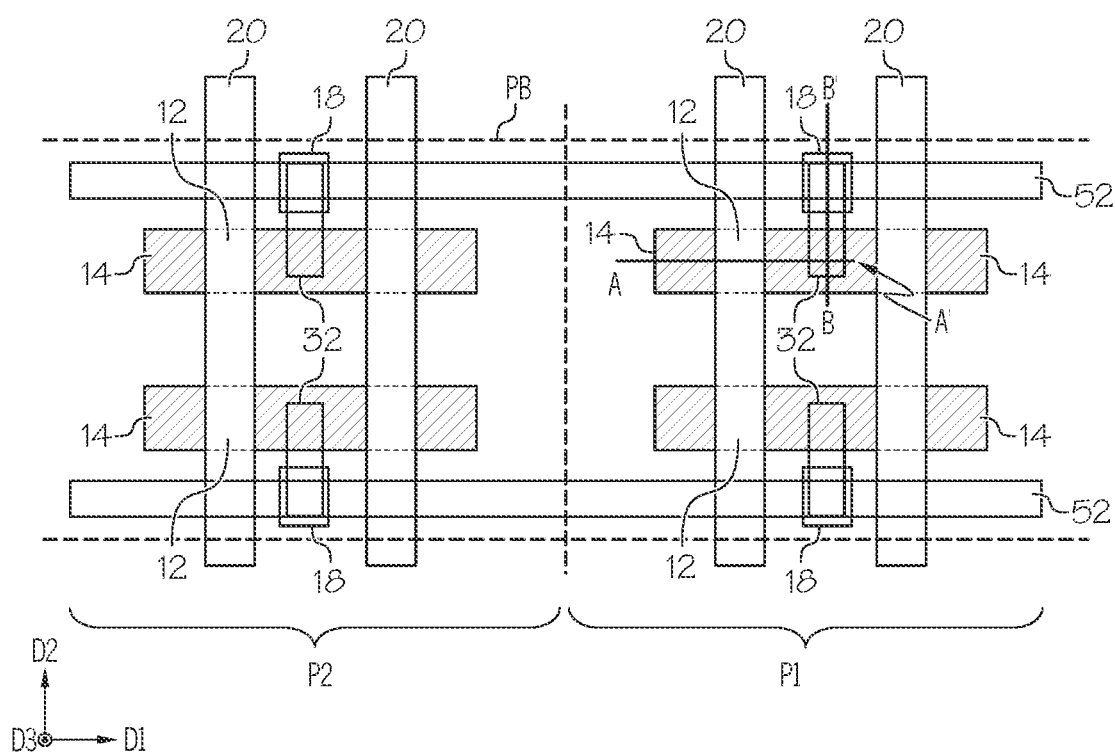
FIG. 1 is a layout of an integrated circuit device according to some embodiments of the present invention.
Figure 2:
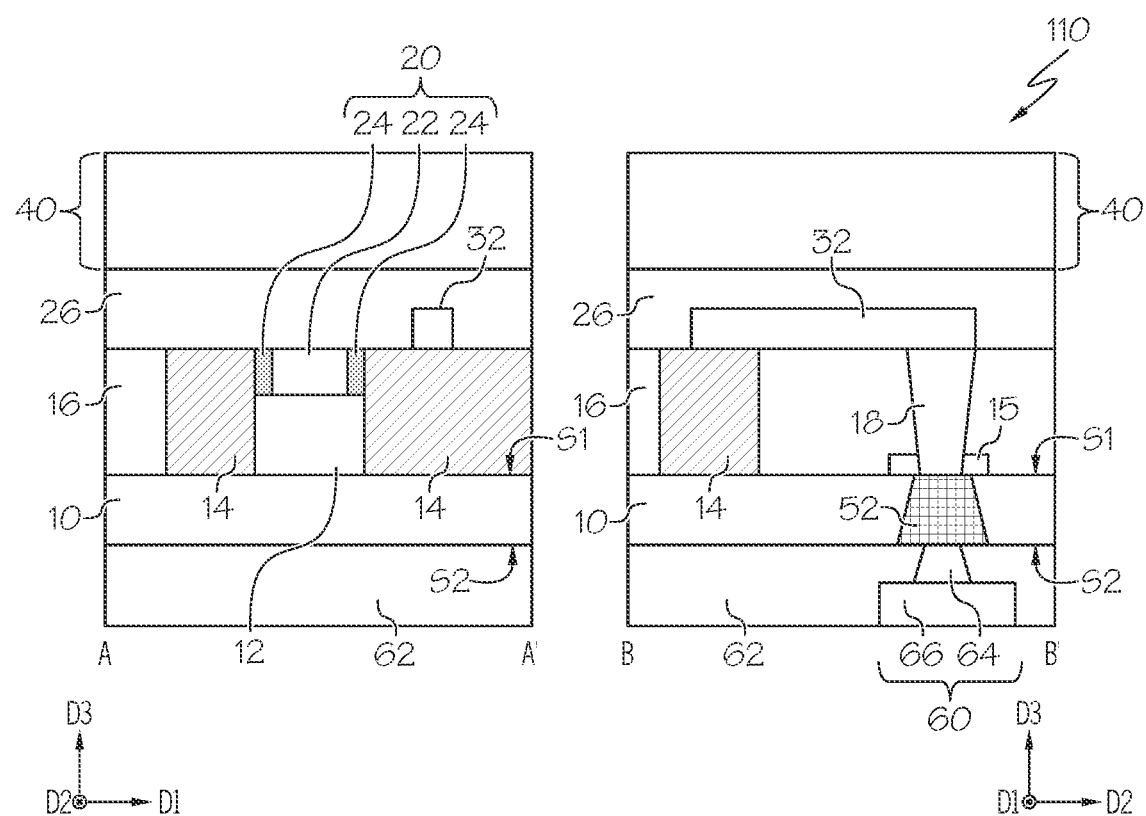
FIG. 2 illustrates cross-sectional views of an integrated circuit device taken along the lines A-A' and B-B' in FIG. 1 according to some embodiments of the present invention.

FIG. 1 is a layout of an integrated circuit device according to some embodiments of the present invention, and FIG. 2 illustrates cross-sectional views of an integrated circuit device 110 taken along the lines A-A' and B-B' in FIG. 1 according to some embodiments of the present invention. In FIG. 1, several elements in FIG. 2 are not shown to simplify the drawing.

Referring to FIGS. 1 and 2, the integrated circuit device 110 may include multiple portions (e.g., a first portion P1 and a second portion P2) that each include transistors. Each of those portions may be surrounded by a boundary PB. Each of those portions may be a standard cell (SC) or a portion of a memory device. In some embodiments, the first portion P1 and the second portion P2 may have the same layout as illustrated in FIG. 1 and may have the same or similar cross-sections.

The first portion P1 may include a transistor including an active region 12, source/drain regions 14 and a gate structure 20 on a first surface S1 of a substrate 10. The substrate 10 may also include a second surface S2 opposite the first surface S1. The first surface S1 and the second surface S2 may be parallel to each other. The substrate 10 may include one or more semiconductor materials, for example, Si, Ge, SiGe, GaP, GaAs, SiC, SiGeC and/or InP. For example, the substrate 10 may be a silicon layer.

The active region 12 may contact the first surface S1 of the substrate 10 and may include opposing side surfaces spaced apart from each other in a first direction D1. The source/drain regions 14 may contact the opposing side surfaces of the active region 12, respectively. The first direction D1 may be parallel to the first surface S1 and the second surface S2 of the substrate 10 and may be a first horizontal direction. The source/drain regions 14 may include a semiconductor material (e.g., Si or SiGe) and impurities (e.g., B, P or As). The gate structure 20 may be on the active region 12.

Although FIG. 2 illustrates a fin field-effect transistor (FinFET) including a single active region 12 protruding from the substrate 10, the transistor may be implemented using various types of transistors (e.g., a planar transistor, a gate-all-around field-effect transistor (GAA FET) or a recessed channel array transistor (RCAT)) which may or may not necessarily contact the substrate 10.

The gate structure 20 may extend longitudinally in a second direction D2. The gate structure 20 may include gate spacers 24 and a gate electrode 22 between the gate spacers 24. Although the gate electrode 22 is illustrated as a single layer, the gate electrode 22 may include multiple layers (e.g., a work function layer and a metal layer). Further, although not illustrated in FIG. 2, a gate insulator and/or an interfacial layer are provided between the active region 12 and the gate electrode 22. The second direction D2 may also be parallel to the first surface S1 and the second surface S2 of the substrate 10 and may be a second horizontal direction. The first direction D1 and the second direction D2 are different from each other. In some embodiments, the first direction D1 and the second direction D2 may be perpendicular to each other.

For example, the gate spacers 24 may include an insulating material (e.g., silicon oxide, silicon nitride, silicon oxynitride, silicon carbide or low-k material), and the gate electrode 22 may include a semiconductor layer (e.g., a poly silicon layer), a work function layer (e.g., TiC layer, TiAl layer, TiAlC layer or TiN layer) and/or a metal layer (e.g., a tungsten layer, an aluminum layer or a copper layer). The low k material may include, for example, fluorine-doped silicon dioxide, organosilicate glass, carbon-doped oxide, porous silicon dioxide, porous organosilicate glass, a spin-on organic polymeric dielectric, or a spin-on silicon based polymeric dielectric.

The transistor may be in a first insulating layer 16, and the first insulating layer 16 may contact the source/drain regions 14. An etch stop layer 15 may be provided on the first surface S1 of the substrate 10 and may contact the first surface S1 of the substrate 10. For example, the etch stop layer 15 may include silicon nitride and/or silicon oxynitride and may have a thickness in a third direction D3 in a range of 0.5 nm to 15 nm. The third direction D3 may be perpendicular to the first surface S1 and the second surface S2 of the substrate 10 and may be a vertical direction.

The first portion P1 may also include a conductive wire 32 and a second insulating layer 26 on the first insulating layer 16. The conductive wire 32 may be in the second insulating layer 26. The conductive wire 32 may be electrically connected to at least one of the source/drain regions 14. In some embodiments, the conductive wire 32 may contact one of the source/drain regions 14 as illustrated in FIG. 2. In some embodiments, the first portion P1 may further include a conductive element (e.g., a conductive via) contacting the source/drain region 14 and the conductive wire 32, and the conductive wire 32 may be electrically connected to the source/drain region 14 through that conductive element.

A back-end metal structure 40 may be provided on the second insulating layer 26. The back-end metal structure 40 may include metal vias and metal lines formed by a BEOL process. Some of the metal lines of the back-end metal structure 40 may be spaced apart from each other in the third direction D3 and may be electrically connected to each other through vias. Although not illustrated, several elements (e.g., the gate electrode 22) may be electrically connected to at least one of the metal lines of the back-end metal structure 40. The metal vias and the metal lines may include, for example, Ru, Co and/or W.

A power rail 52 may be provided in the substrate 10. The power rail 52 may include opposing surfaces that the substrate 10 does not contact. One of those opposing surfaces of the power rail 52 may be coplanar with the first surface S1 of the substrate 10, as illustrated in FIG. 2. The power rail 52 may be electrically connected to the conductive wire 32 through a conductive plug 18 that is in the first insulating layer 16. For example, the conductive plug 18, the conductive wire 32, and the power rail 52 may include Ru, Co and/or W. In some embodiments, the conductive plug 18, the conductive wire 32, and the power rail 52 may include different materials.

In some embodiments, the power rail 52 may include opposing side surfaces that may contact the substrate 10 and may be slanted with respect to the first surface S1 of the substrate 10. A distance between those opposing side surfaces of the power rail 52 in a horizontal direction (e.g., the second direction D2) may increase along a direction from the first surface S1 to the second surface S2 of the substrate 10, as illustrated in FIG. 2.

Referring to FIG. 1, each portion (e.g., the first portion P1 or the second portion P2) may include two power rails 52. Each of the power rails 52 may be electrically connected to a power source having a voltage (e.g., positive voltage, zero voltage or ground voltage) and may supply power to one of source/drain regions 14 of a transistor. Each of the power rails 52 may extend longitudinally in the first direction D1 and may be shared by multiple portions. In some embodiments, the power rails 52 may extend parallel to the boundary PB between portions.

The conductive plug 18 may extend through the etch stop layer 15 and may contact the power rail 52. In some embodiments, the conductive plug 18 may contact the conductive wire 32. In some embodiments, the conductive plug 18 and the conductive wire 32 may include the same material and an interface between the conductive plug 18 and the conductive wire 32 may not be visible. In some embodiments, the conductive plug 18 may include opposing side surfaces that may contact the first insulating layer 16 and may be slanted with respect to the first surface S1 of the substrate 10. A distance between those opposing side surfaces of the conductive plug 18 in a horizontal direction (e.g., the second direction D2) may increase with increasing distance from the first surface S1 of the substrate 10 as illustrated in FIG. 2.

A power delivery network (PDN) structure 60 including a power via 64 and a power metal wire 66 may be provided on the second surface S2 of the substrate 10. The PDN structure 60 may be electrically connected to the power rail 52. In some embodiments, the power via 64 may contact the power rail 52 as illustrated in FIG. 2. The PDN structure 60 may be provided in a third insulating layer 62. In some embodiments, the third insulating layer 62 may contact the second surface S2 of the substrate 10. Although FIG. 2 illustrates one power via 64 and one power metal wire 66, the integrated circuit device may include multiple power vias 64 and multiple power metal wires 66. The power via 64 and the power metal wire 66 may include, for example, Ru, Co and/or W.

The first insulating layer 16, the second insulating layer 26, and the third insulating layer 62 may include, for example, silicon oxide, silicon carbide and/or low-k material.

Figure 3:
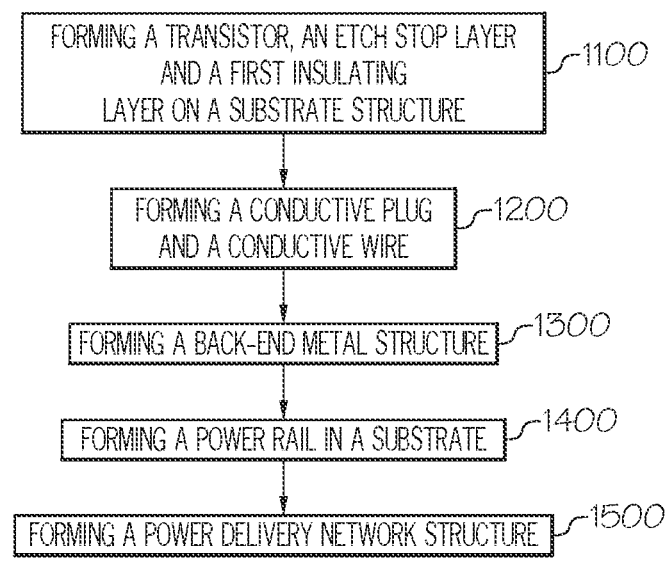
FIG. 3 is a flow chart of methods of forming an integrated circuit device according to some embodiments of the present invention.

FIG. 3 is a flow chart of methods of forming the integrated circuit device 110 illustrated in FIG. 2 according to some embodiments of the present invention, and FIGS. 4 through 14 are cross-sectional views illustrating methods of forming the integrated circuit device 110 according to some embodiments of the present invention.

Referring to FIGS. 3 through 7, the methods may include forming a transistor and a first insulating layer 16 on a substrate structure 10S (Block 1100). The substrate structure 10S may include a substrate 10 and a buried portion 11. In some embodiments, the substrate structure 10S may be a bulk substrate (e.g., a bulk semiconductor wafer), and the substrate 10 and the buried portion 11 may include the same semiconductor material. In some embodiments, the substrate structure 10S may be a semiconductor on insulator (SOI) substrate, and the substrate 10 may be a semiconductor layer (e.g., a silicon layer), and the buried portion 11 may include an insulating layer (e.g., a silicon oxide layer).

Figure 4:
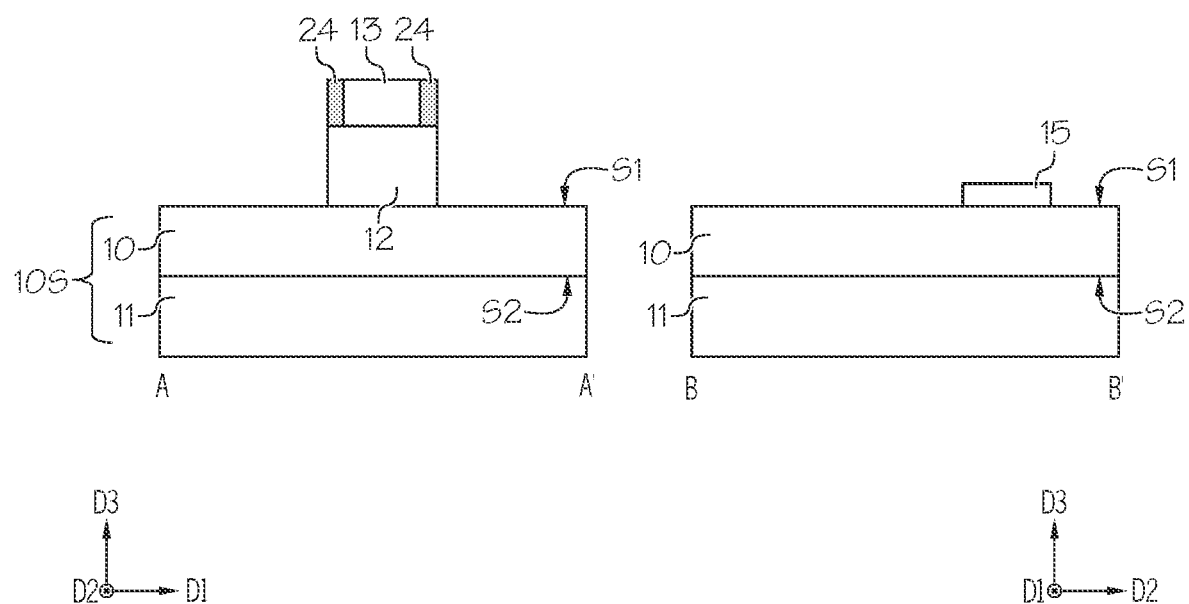
FIGS. 4 through 14 are cross-sectional views illustrating methods of forming an integrated circuit device according to some embodiments of the present invention.

Referring to FIG. 4, the methods may include forming an active region 12 on a first surface S1 of the substrate 10. In some embodiments, the active region 12 may be formed by etching the substrate 10 using gate spacers 24 and a mask layer 13 as an etch mask. In some embodiments, the active region 12 may be grown by an epitaxial growth process using the substrate 10 as a seed layer, and then the gate spacers 24 and the mask layer 13 may be formed on the active region 12. The active region 12 may protrude from the first surface S1 of the substrate 10 in the third direction D3. An etch stop layer 15 may be formed on the first surface S1 of the substrate 10. The etch stop layer 15 may contact the first surface S1 of the substrate 10 as illustrated in FIG. 4.

Figure 5:
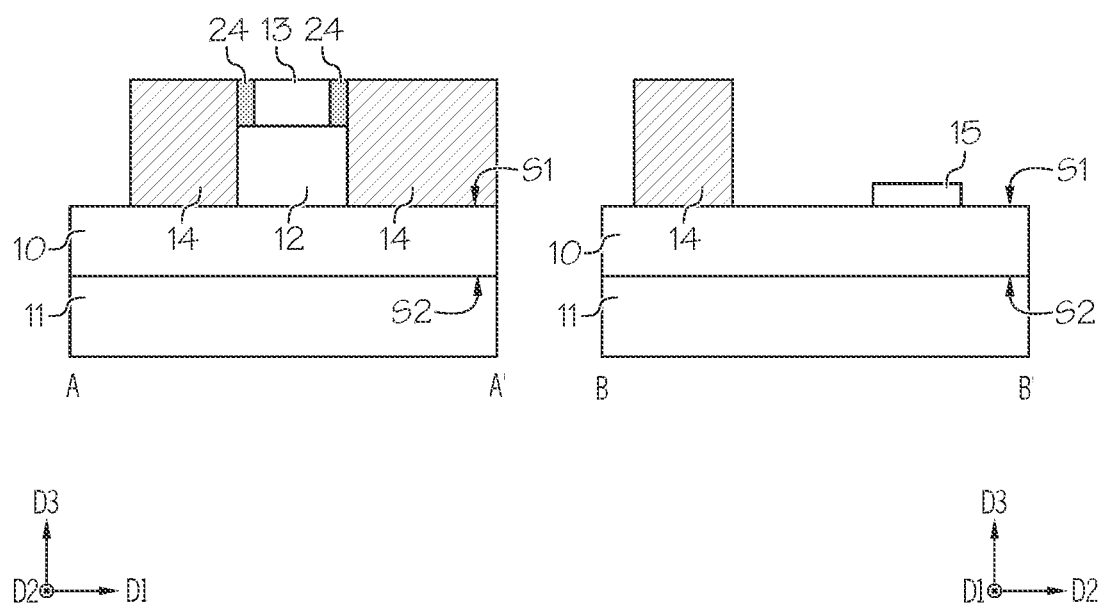

Referring to FIG. 5, source/drain regions 14 may be formed on the substrate 10. The source/drain regions 14 may contact opposing side surfaces of the active region 12, respectively. The source/drain regions 14 may be formed by various processes. In some embodiments, the source/drain regions 14 may be formed by performing an epitaxial growth process using the active region 12 as a seed layer. Although FIGS. 4 and 5 illustrate that the etch stop layer 15 is formed before the source/drain regions 14 are formed, in some embodiments, the etch stop layer 15 may be formed after the source/drain regions 14 are formed.

Figure 6:
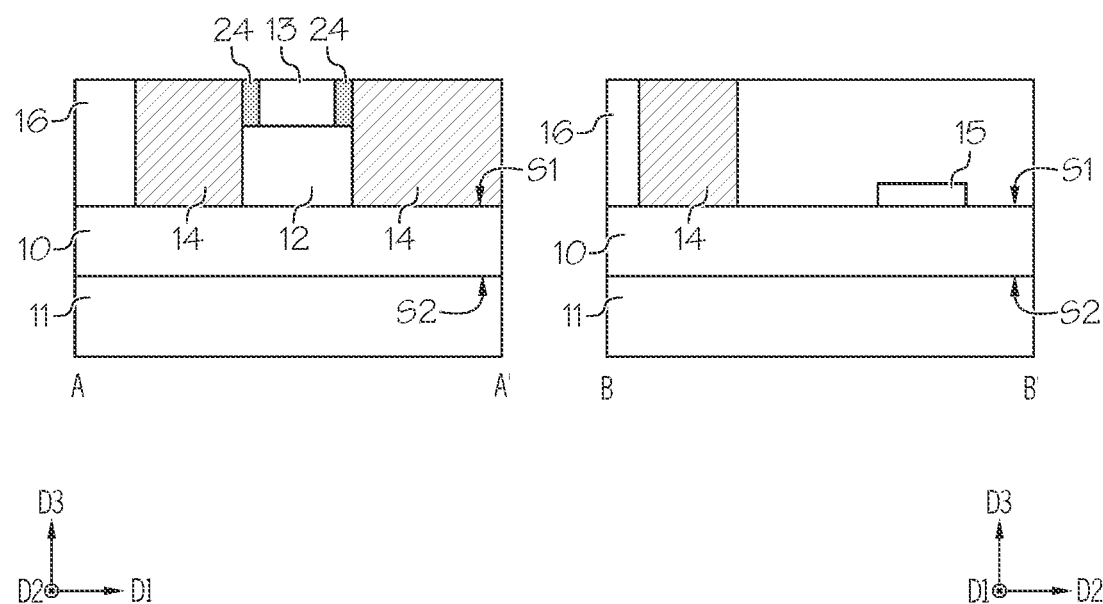
Figure 7:
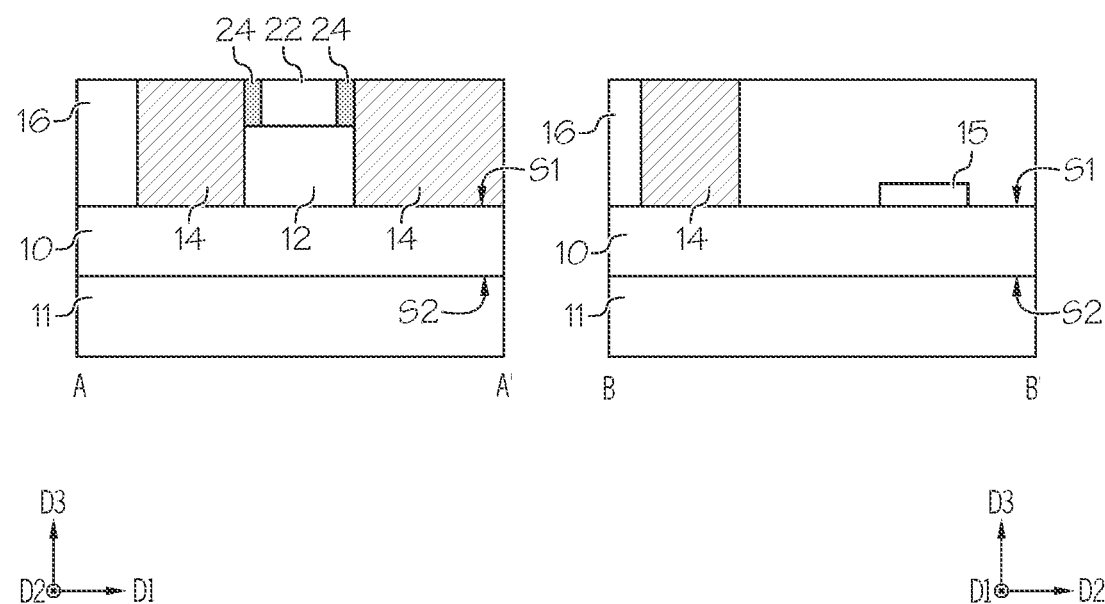

Referring to FIG. 6, a first insulating layer 16 may be formed on the substrate 10. The source/drain regions 14, the etch stop layer 15, the gate spacers 24 and the mask layer 13 may be in the first insulating layer 16. The first insulating layer 16 may expose the gate spacers 24 and the mask layer 13. Referring to FIG. 7, the mask layer 13 may be replaced with a gate electrode 22.

Figure 8:
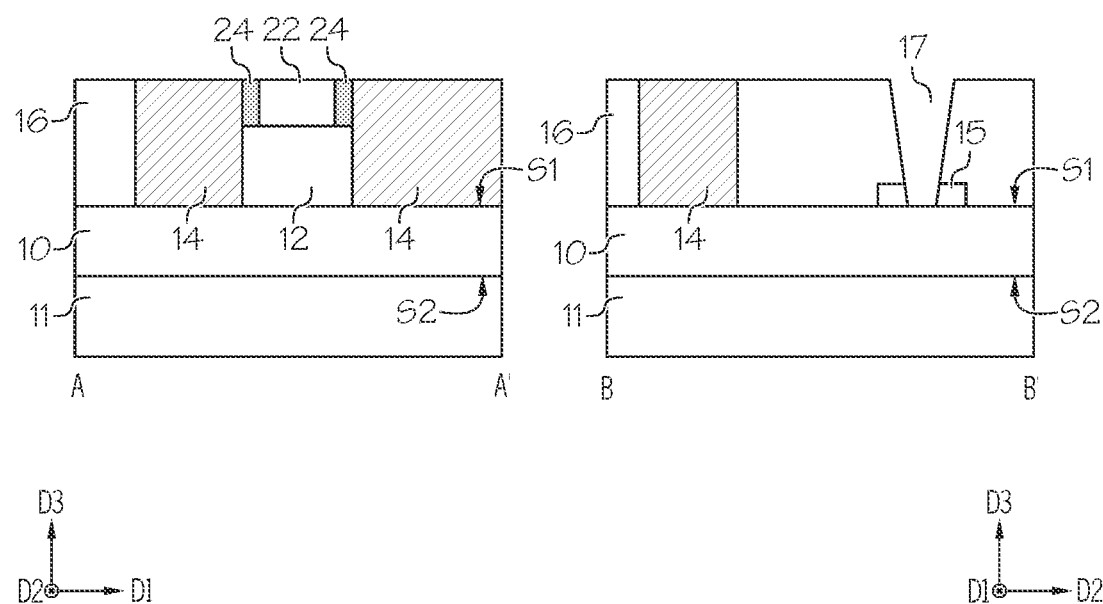
Figure 9:
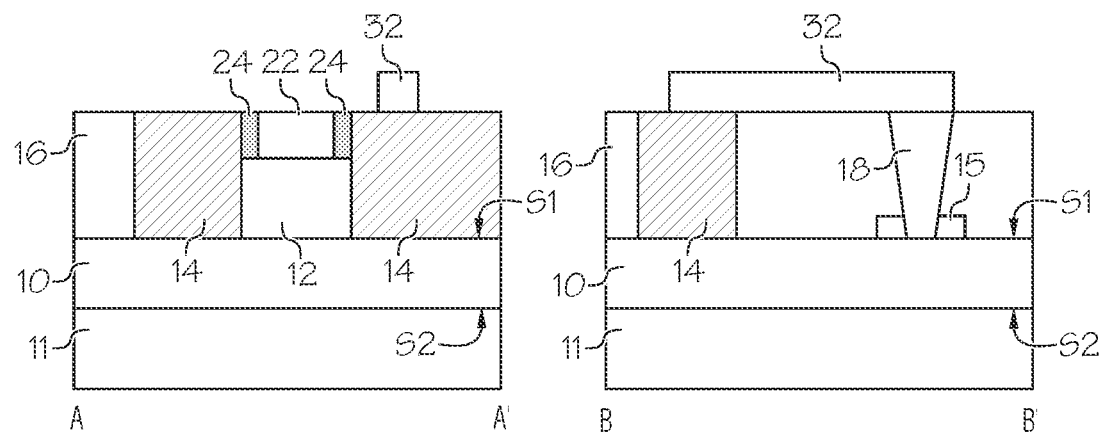

Referring to FIGS. 3, 8 and 9, a conductive plug 18 and a conductive wire 32 may be formed (Block 1200). Referring to FIG. 8, an opening 17 may be formed in the first insulating layer 16. In some embodiments, the opening 17 may be formed using a two-step etch process. For example, a patterned mask layer (not illustrated) may be formed on the first insulating layer 16 and then a portion of the first insulating layer 16 may be etched until the etch stop layer 15 is exposed. After then, a portion of the etch stop layer 15 may be etched until the substrate 10 is exposed. The patterned mask layer may be removed before or after the etch stop layer 15 is etched. The opening 17 may extend through the first insulating layer 16 and the etch stop layer 15, as illustrated in FIG. 8.

Referring to FIG. 9, the conductive plug 18 may be formed in the opening 17, and the conductive wire 32 may be formed on the first insulating layer 16. In some embodiments, the conductive plug 18 may be formed before the conductive wire 32 is formed. For example, a first conductive layer may be formed in the opening 17 and on the first insulating layer 16 and then a portion of the first conductive layer formed on the first insulating layer 16 may be removed to expose the first insulating layer 16, thereby forming the conductive plug 18 in the opening 17. After that, a second conductive layer may be formed on the conductive plug 18 and on the first insulating layer 16 and may be patterned to form the conductive wire 32. In some embodiments, a single conductive layer may be used to form the conductive plug 18 and the conductive wire 32. For example, a conductive layer may be formed in the opening 17 and on the first insulating layer 16 and then a planarization process may be performed on the conductive layer. After then, the conductive layer may be patterned to form the conductive wire 32.

Figure 10:
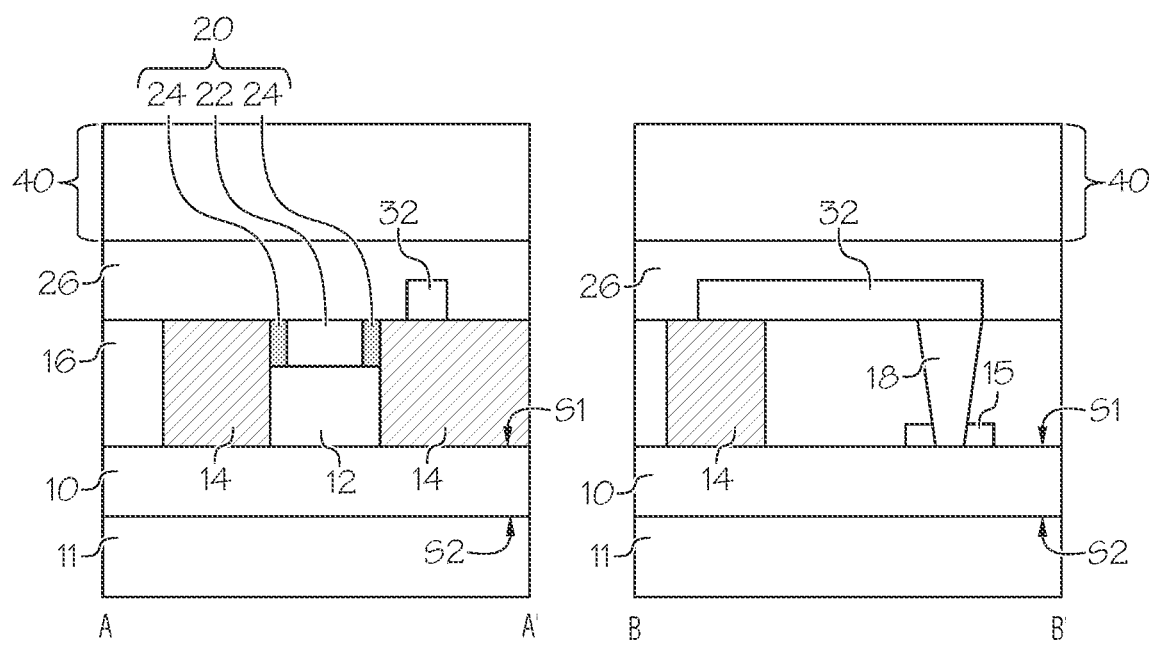

Referring to FIGS. 3 and 10, the methods may further include forming a back-end metal structure 40 (Block 1300). The back-end metal structure 40 may be formed by a BEOL process. In some embodiments, a second insulating layer 26 may be formed on the conductive wire 32 before forming the back-end metal structure 40.

Figure 11:
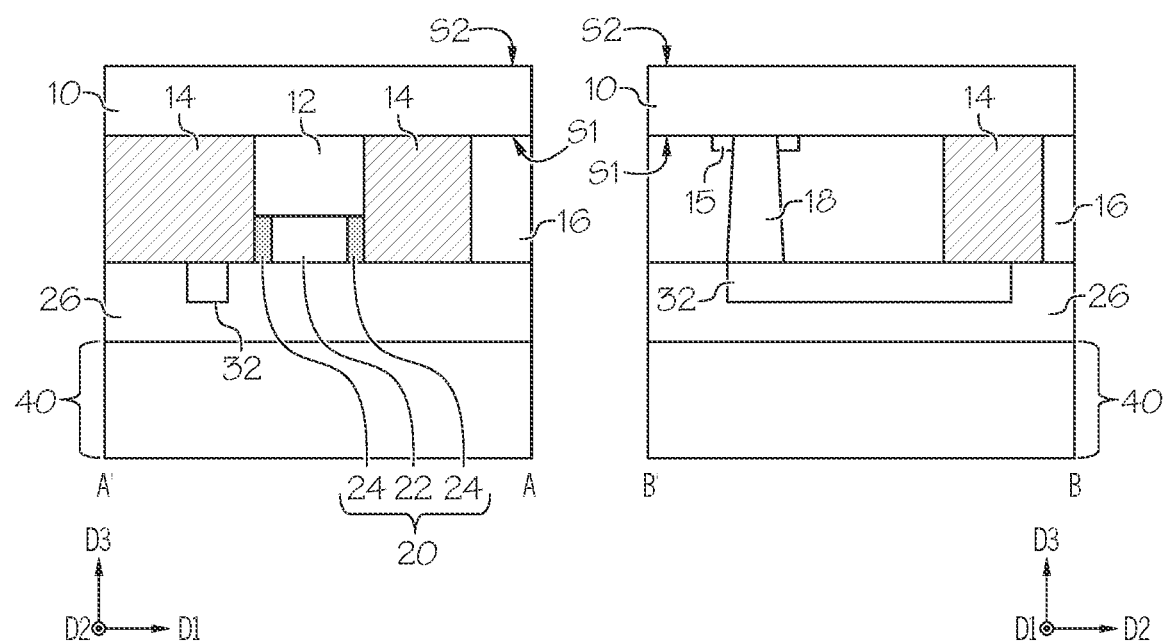

Referring to FIGS. 3 and 11 through 13, a power rail 52 may be formed in the substrate 10 (Block 1400). Referring to FIG. 11, the structure shown in FIG. 10 may be turned around (e.g., flipped), and the buried portion 11 of the substrate structure 10S may be removed to expose the second surface S2 of the substrate 10. The buried portion 11 may be removed by a grinding process and/or an etch process (e.g., a wet etch process and/or a dry etch process). After the buried portion 11 is removed, a thickness of the substrate 10 may be in a range of 50 nm to 100 nm.

Figure 12:
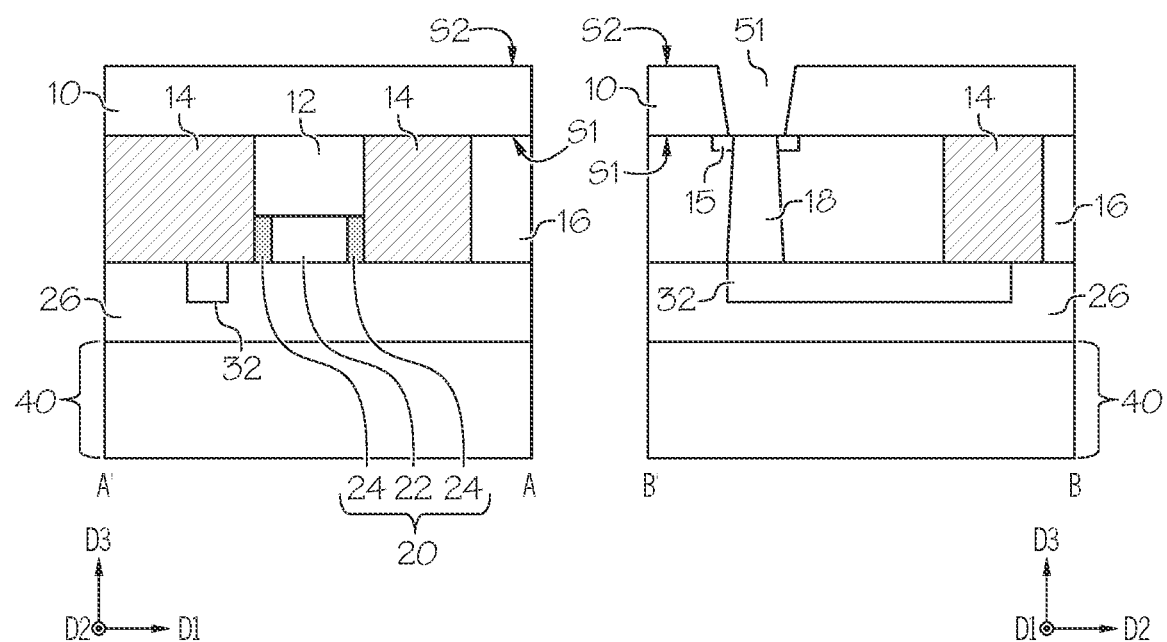
Figure 13:
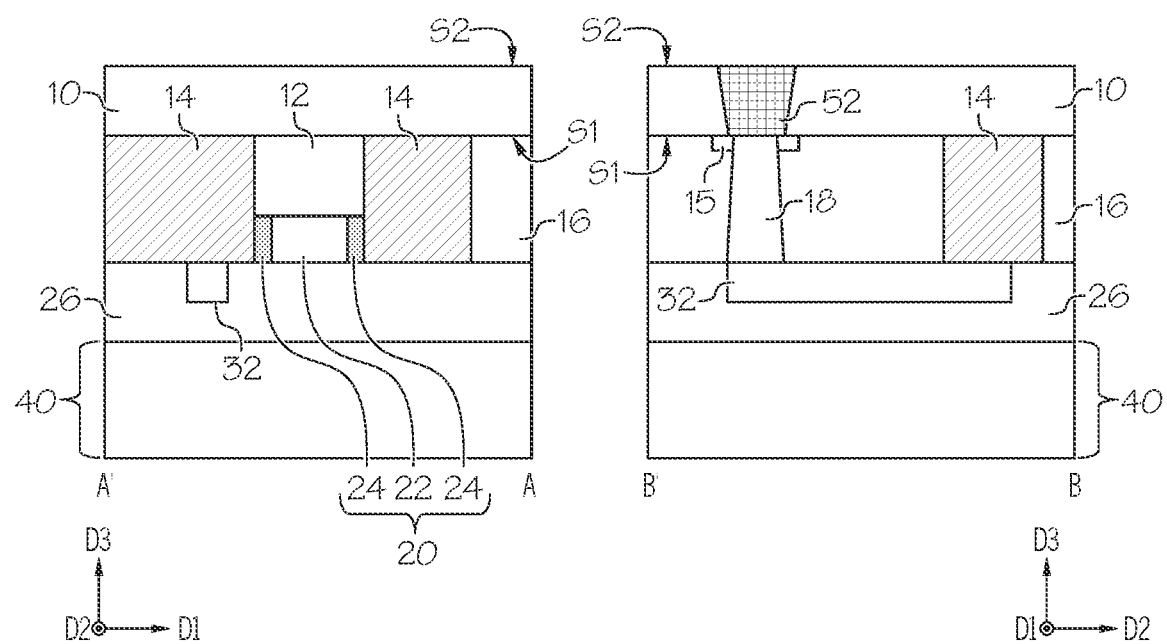

Referring to FIG. 12, a trench 51 may be formed by etching the second surface S2 of the substrate 10. An etching process is performed on the second surface S2 of the substrate 10, and thus the trench 51 may have a wider width in a horizontal direction (e.g., the second direction D2) adjacent the second surface S2 of the substrate 10, and the width of the trench 51 may decrease along the direction from the second surface S2 to the first surface S1 of the substrate 10. In some embodiments, the trench 51 may extend through the substrate 10 and may expose the conductive plug 18, as illustrated in FIG. 12. Referring to FIG. 13, the power rail 52 may be formed in the trench 51. The power rail 52 may contact the conductive plug 18.

Figure 14:
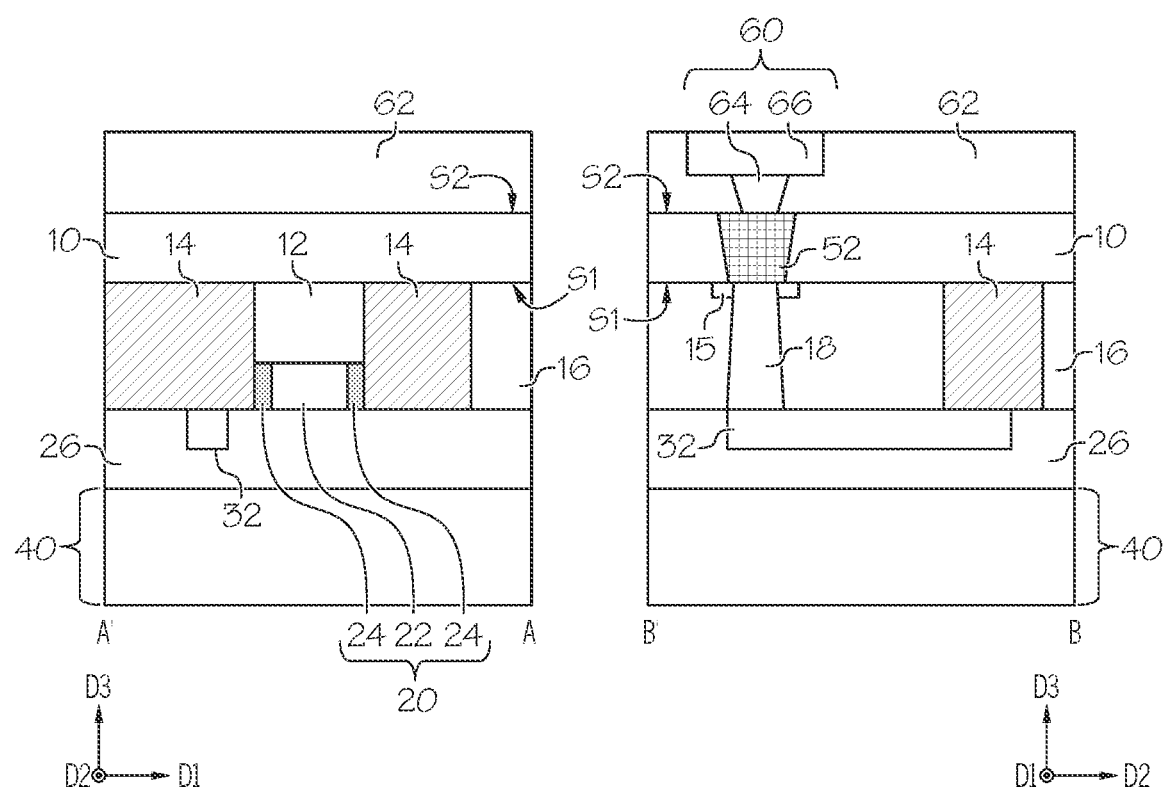

Referring to FIGS. 3 and 14, a PDN structure 60 including a power via 64 and a power metal wire 66 may be formed on the power rail 52 (Block 1500). A third insulating layer 62 may also be formed on the power rail 52, and the power via 64 and the power metal wire 66 may be provided in the third insulating layer 62.

When the buried portion 11 of the substrate structure 10S includes an insulating layer, the buried portion 11 of the substrate structure 10S may not be removed, and the trench 51 may be formed by etching the buried portion 11 and then etching the second surface S2 of the substrate 10. The remaining portion of the buried portion 11 may remain on the second surface S2 of the substrate 10, and the power via 64 and the power metal wire 66 may be formed in the buried portion 11 of the substrate structure 10S.

Figure 15:
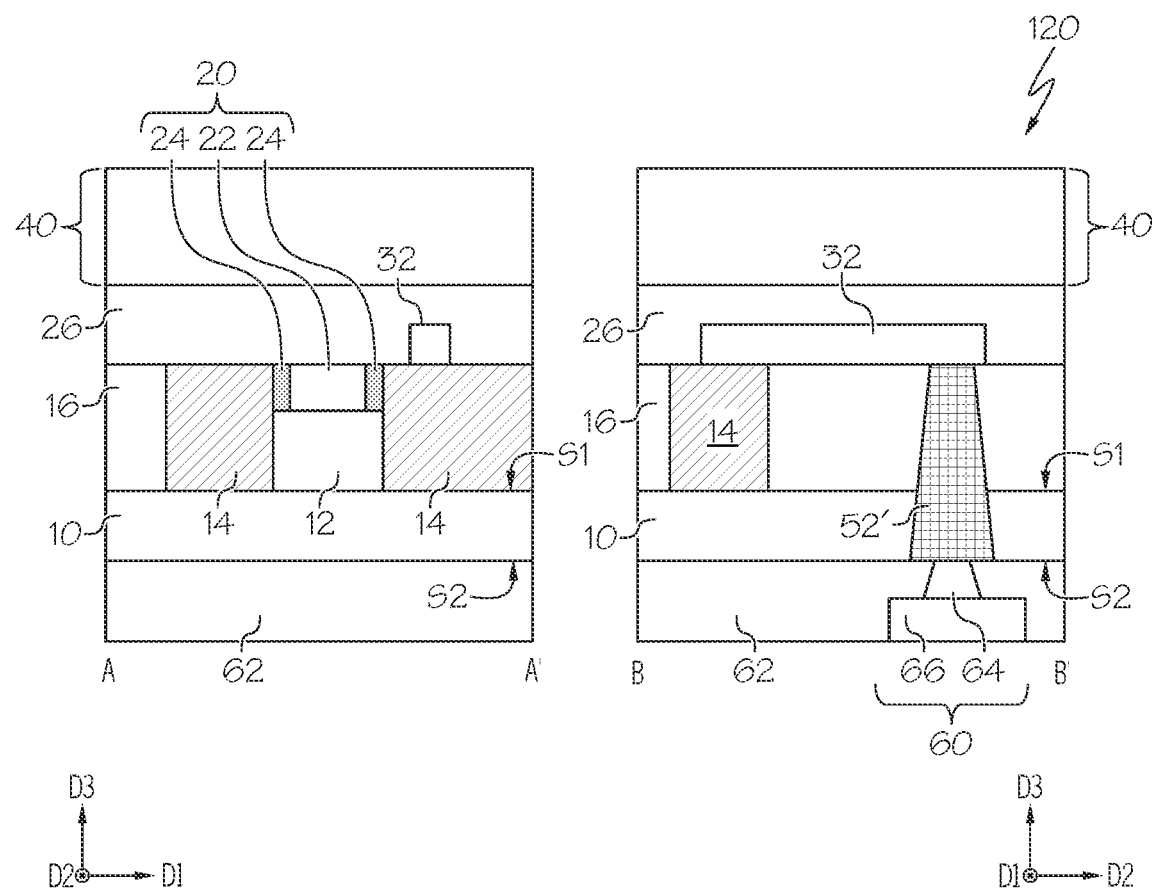
FIG. 15 illustrates cross-sectional views of an integrated circuit device taken along the lines A-A' and B-B' in FIG. 1 according to some embodiments of the present invention.

FIG. 15 illustrates cross-sectional views of an integrated circuit device 120 taken along the lines A-A' and B-B' in FIG. 1 according to some embodiments of the present invention. The integrated circuit device 120 may be the same as or similar to the integrated circuit device 110 in FIG. 2, with primary differences being that the etch stop layer 15 and the conductive plug 18 in FIG. 2 are not formed, and a portion of a power rail 52' is provided in the first insulating layer 16.

Referring to FIG. 15, the power rail 52' may include a first portion in the substrate 10 and a second portion in the first insulating layer 16. The first portion of the power rail 52' may include opposing side surfaces that may contact the substrate 10 and may be slanted with respect to the first surface S1 of the substrate 10. A distance between those opposing side surfaces of the first portion of the power rail 52' in a horizontal direction (e.g., the second direction D2) may decrease along a direction from the second surface S2 to the first surface S1 of the substrate 10. The second portion of the power rail 52' may include opposing side surfaces that may contact the first insulating layer 16 and may also be slanted with respect to the first surface S1 of the substrate 10. A distance between those opposing side surfaces of the second portion of the power rail 52' in a horizontal direction (e.g., the second direction D2) may decrease with increasing distance from the first surface S1 of the substrate 10.

Figure 16:
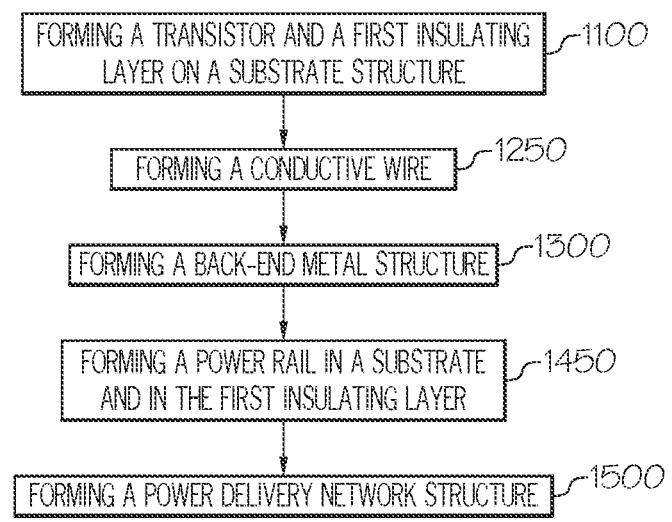
FIG. 16 is a flow chart of methods of forming an integrated circuit device according to some embodiments of the present invention.

FIG. 16 is a flow chart of methods of forming the integrated circuit device 120 according to some embodiments of the present invention, FIGS. 17 through 22 are cross-sectional views illustrating methods of forming the integrated circuit device 120 according to some embodiments of the present invention.

Figure 17:
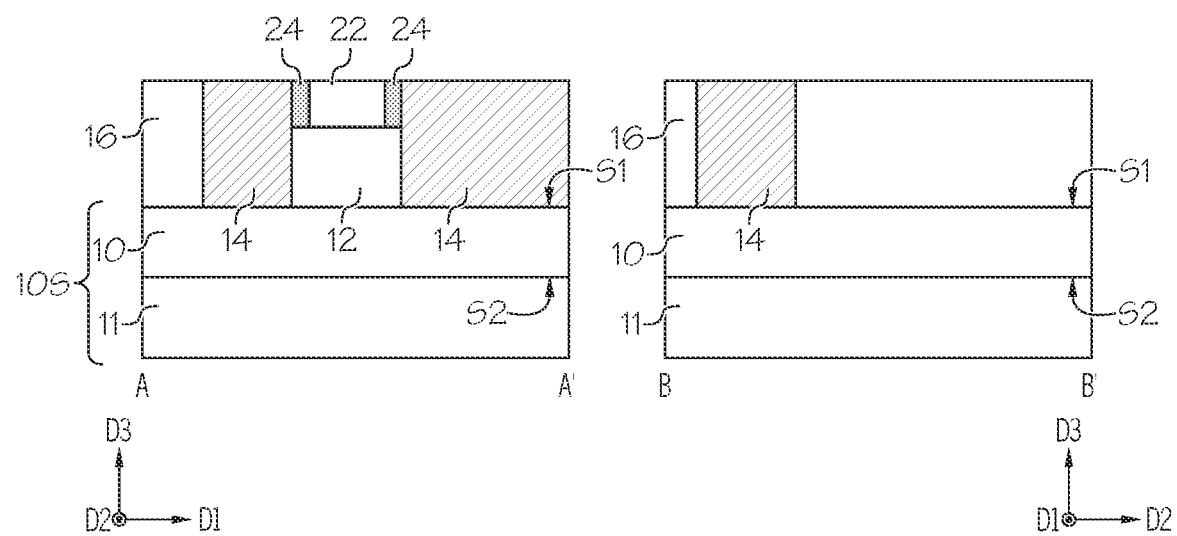
FIGS. 17 through 22 are cross-sectional views illustrating methods of forming an integrated circuit device according to some embodiments of the present invention.

Referring to FIGS. 16 and 17, the methods may include forming a transistor and a first insulating layer on a substrate structure 10S (Block 1100). Processes performed for Block 1100 may be the same as or similar to those described with reference to FIGS. 4 through 7, with a primary difference being that the etch stop layer 15 is not formed.

Figure 18:
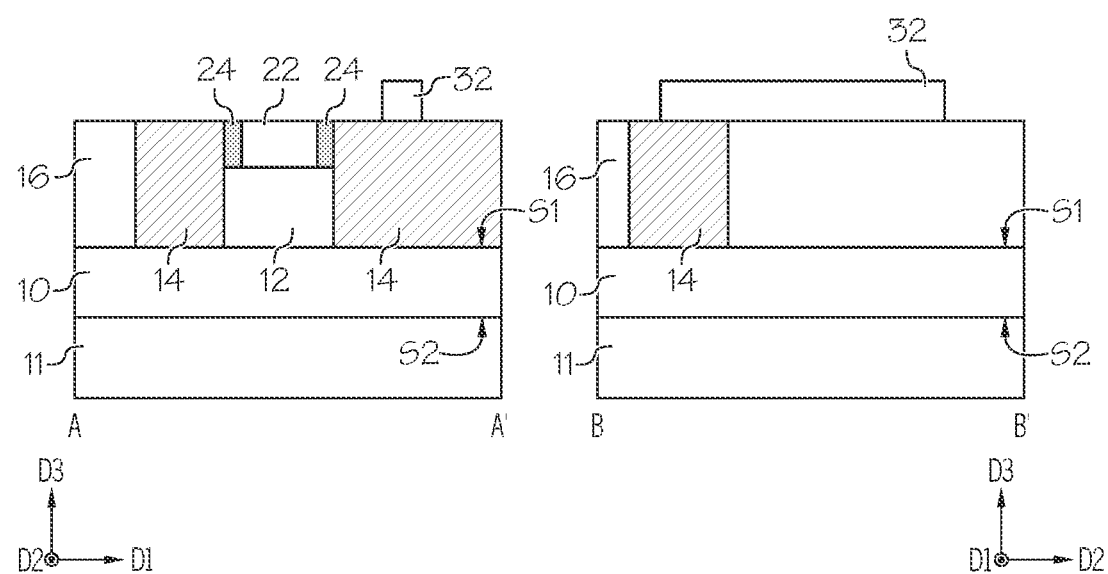

Referring to FIGS. 16 and 18, a conductive wire 32 may be formed (Block 1250). The conductive wire 32 may be formed on the source/drain region 14 and the first insulating layer 16.

Figure 19:
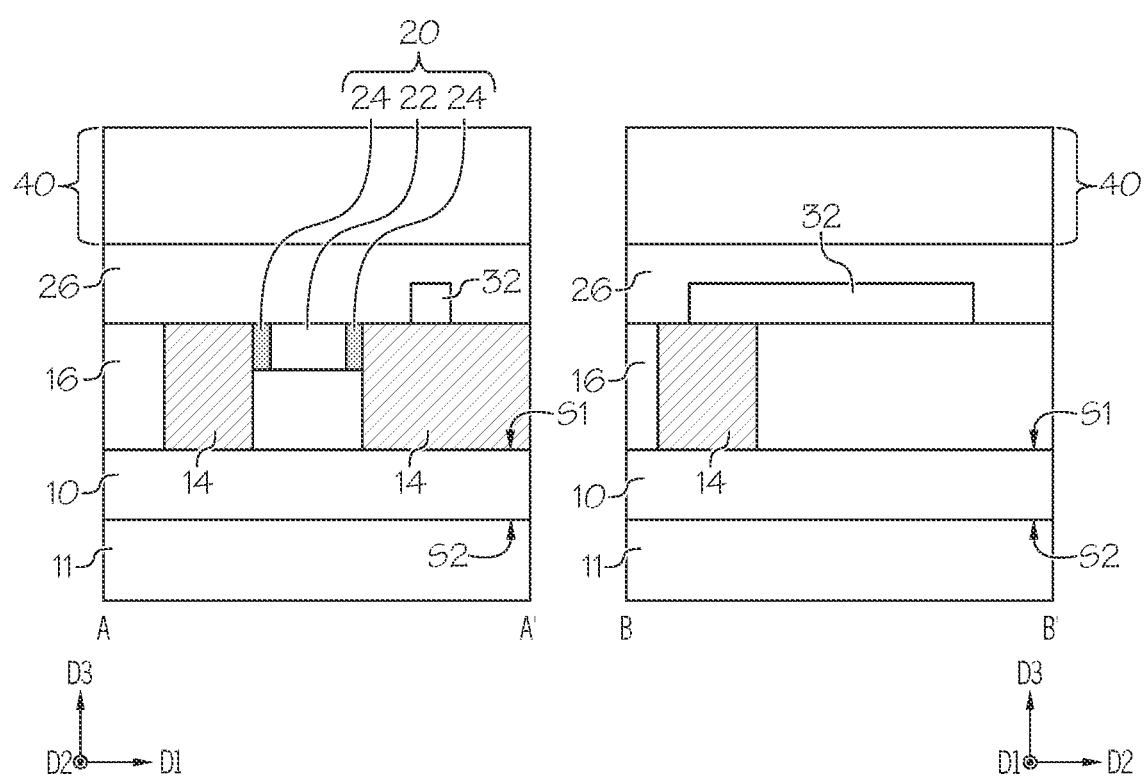

Referring to FIGS. 16 and 19, a back-end metal structure 40 may be formed (Block 1300). In some embodiments, a second insulating layer 26 may be formed on the conductive wire 32 before forming the back-end metal structure 40.

Figure 20:
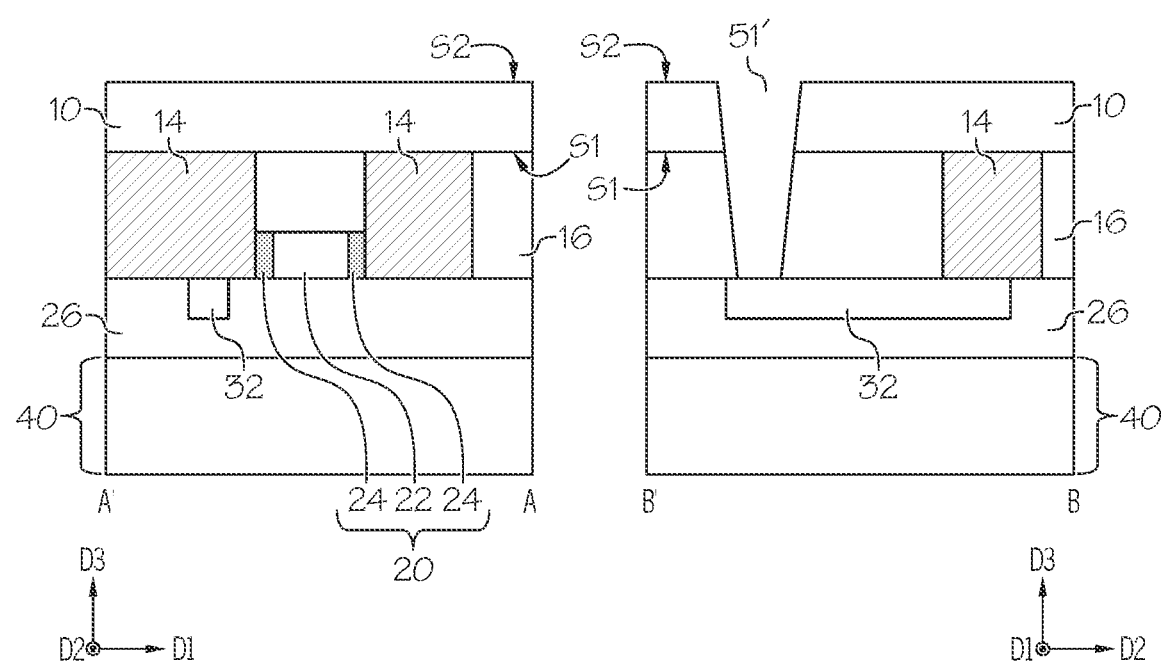
Figure 21:
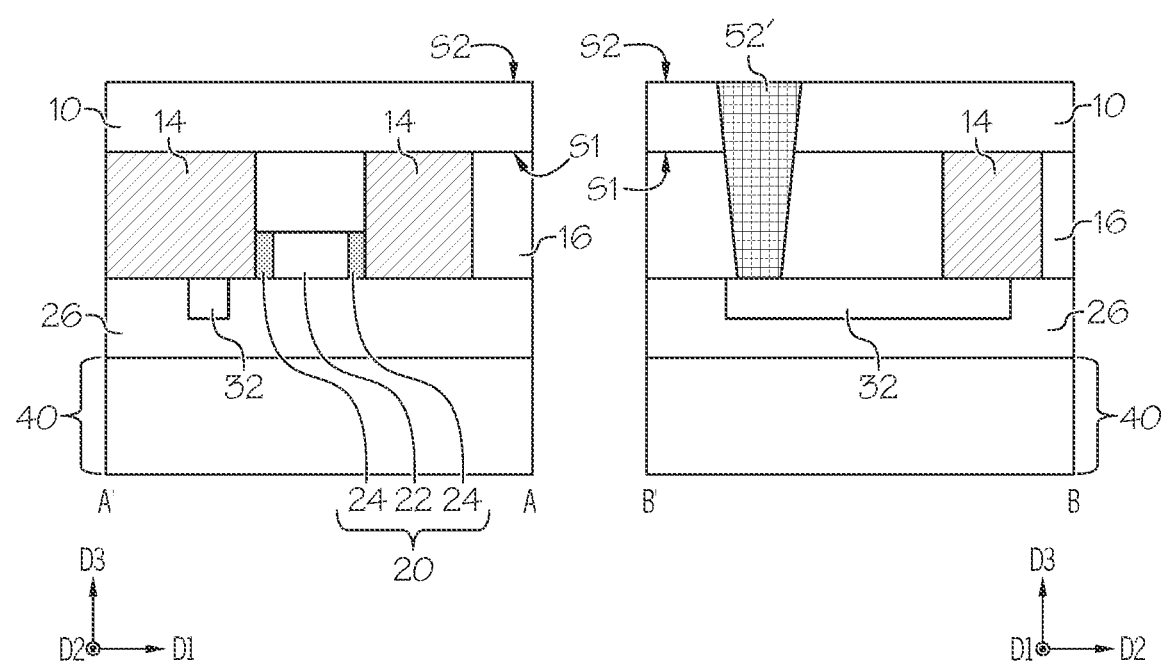

Referring to FIGS. 16, 20 and 21, a power rail 52 may be formed in the substrate 10 and in the first insulating layer 16 (Block 1450). Referring to FIG. 20, the structure shown in FIG. 19 may be turned around (e.g., flipped), and then the buried portion 11 of the substrate structure 10S may be removed to expose the second surface S2 of the substrate 10. Referring to FIG. 20, a trench 51' may be formed by etching the second surface S2 of the substrate 10 and the first insulating layer 16. An etching process is performed on the second surface S2 of the substrate 10, and thus the trench 51' may have a wider width in a horizontal direction (e.g., the second direction D2) adjacent the second surface S2 of the substrate 10, and the width of the trench 51' may decrease with increasing distance from the second surface S2 of the substrate 10, as illustrated in FIG. 20. In some embodiments, the trench 51' may extend through the substrate 10 and the first insulating layer 16 and may expose the conductive wire 32, as illustrated in FIG. 20.

Referring to FIG. 21, a power rail 52' may be formed in the trench 51'. The power rail 52' may contact the conductive wire 32.

Figure 22:
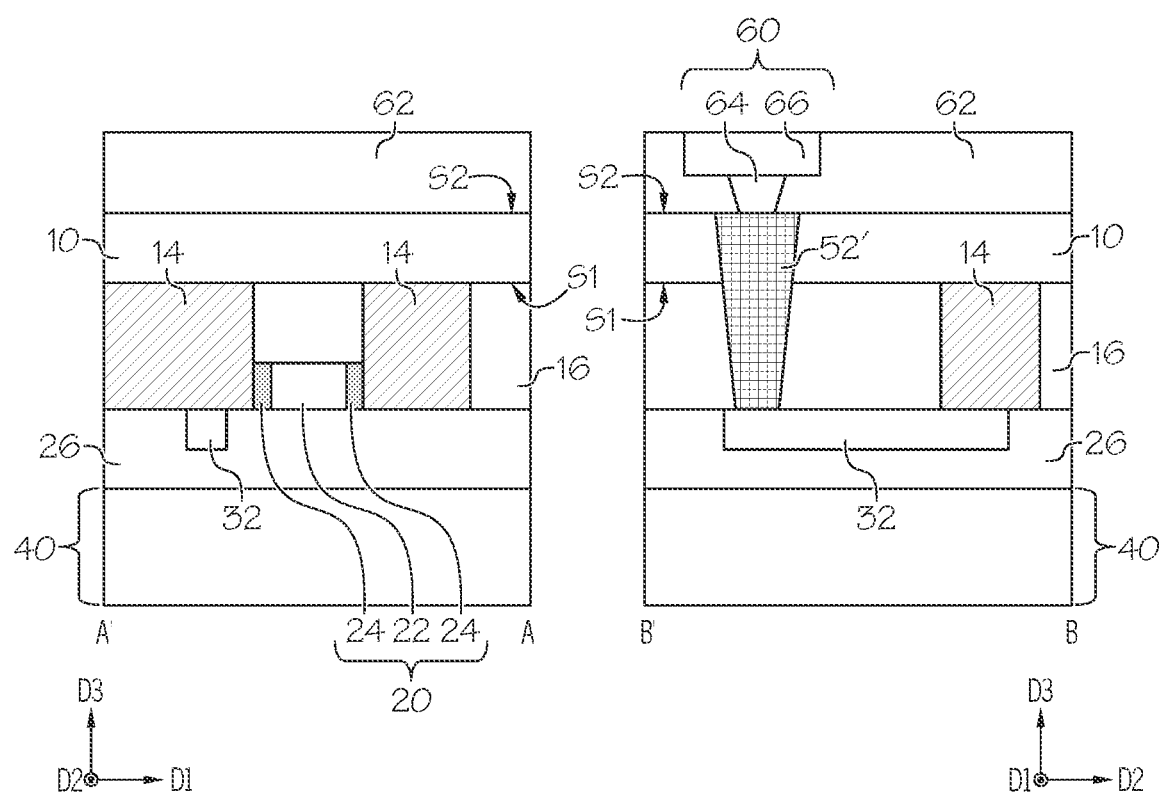

Referring to FIGS. 16 and 22, a PDN structure 60 including a power via 64 and a power metal wire 66 may be formed on the power rail 52' (Block 1500).

Figure 23:
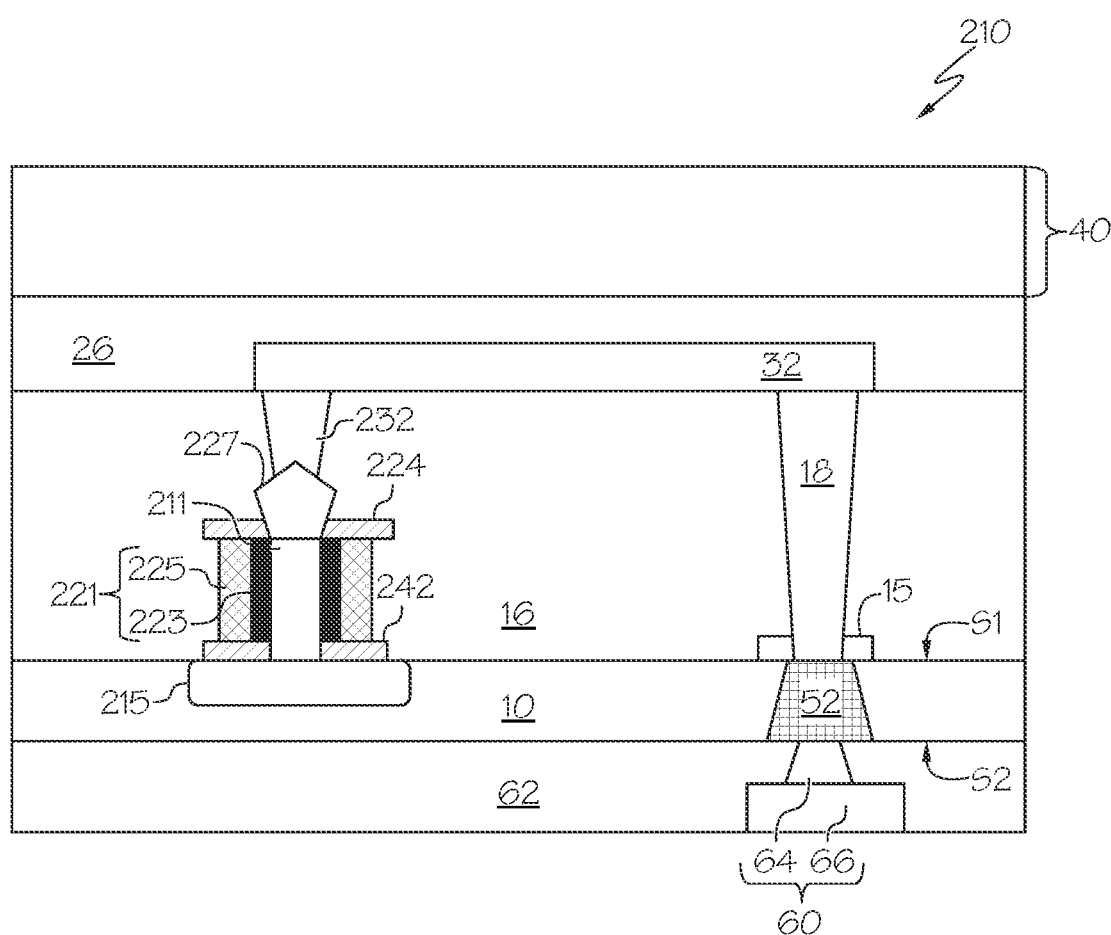
FIGS. 23 and 24 are cross-sectional views of integrated circuit devices according to some embodiments of the present invention.

FIG. 23 is a cross-sectional view of an integrated circuit device 210 according to some embodiments of the present invention. The integrated circuit device 210 may be the same as or similar to the integrated circuit device 110 in FIG. 2, with a primary difference being that a transistor of the integrated circuit device is a vertical field effect transistor (VFET).

Referring to FIG. 23, the VFET may include an active region 211, a bottom source/drain region 215, a top source/drain region 227 and a gate structure 221. The bottom source/drain region 215 may be formed in the substrate 10 and may contact a lower surface of the active region 211. The top source/drain region 227 may be formed on an upper surface of the active region 211 and may contact the upper surface of the active region 211.

The gate structure 221 may be provided between the bottom source/drain region 215 and the top source/drain region 227. The gate structure 221 may include a gate insulator 223 and a gate electrode 225. Further, a bottom spacer 242 and a top spacer 244 may be provided. The bottom spacer 242 may separate the gate electrode 225 from the bottom source/drain region 215 for electrical isolation between the gate electrode 225 and the bottom source/drain region 215. The top spacer 244 may separate the gate electrode 225 from the top source/drain region 227 for electrical isolation between the gate electrode 225 and the top source/drain region 227. The bottom spacer 242 and the top spacer 244 may include an insulating material (e.g., silicon oxide, silicon nitride, silicon oxynitride, silicon carbide and/or low-k material).

The integrated circuit device 210 may also include a source/drain contact 232 electrically connecting the top source/drain region 227 to the conductive wire 32. In some embodiments, the source/drain contact 232 may contact the top source/drain region 227. In some embodiments, the source/drain contact 232 may electrically connect the bottom source/drain region 215, instead of the top source/drain region 227, to the conductive wire 32.

Figure 24:
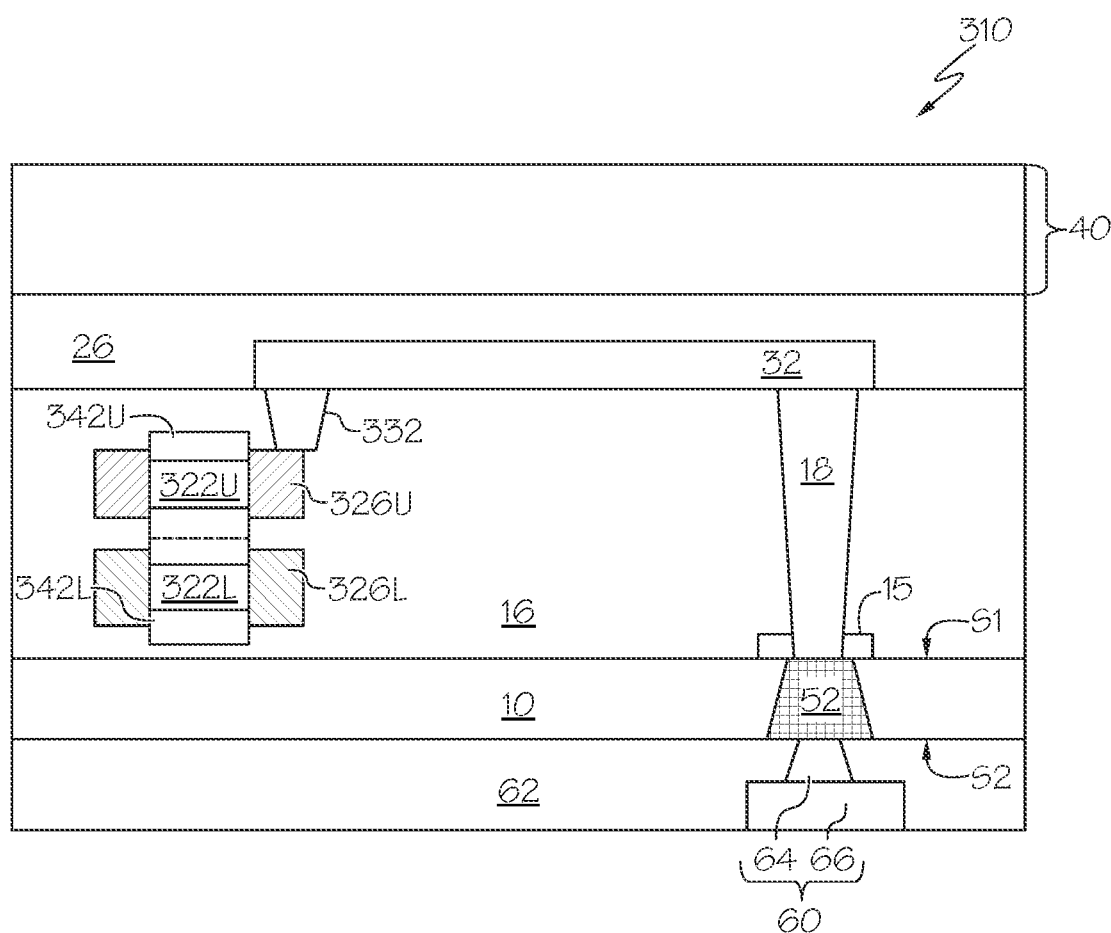

FIG. 24 is a cross-sectional view of an integrated circuit device 310 according to some embodiments of the present invention. The integrated circuit device 310 may be the same as or similar to the integrated circuit device 110 in FIG. 2, with a primary difference being that the integrated circuit device 310 includes a stacked transistor structure.

Referring to FIG. 24, the stacked transistor structure may include an upper transistor and a lower transistor that is between the substrate 10 and the upper transistor. The upper transistor may include an upper active region 322U, upper source/drain regions 326U and an upper gate electrode 342U. The upper source/drain regions 326U may contact opposing side surfaces of the upper active region 322U, respectively. The lower transistor may include a lower active region 322L, lower source/drain regions 326L and a lower gate electrode 342L. The lower source/drain regions 326L may contact opposing side surfaces of the lower active region 322L, respectively. Although FIG. 24 illustrates that the upper gate electrode 342U and the lower gate electrode 342L contact each other, in some embodiments, the upper gate electrode 342U and the lower gate electrode 342L may be separated from each other by a gate isolation layer.

The integrated circuit device 310 may also include a source/drain contact 332 electrically connecting the upper source/drain region 326U to the conductive wire 32. In some embodiments, the source/drain contact 332 may contact the upper source/drain region 326U. In some embodiments, the source/drain contact 332 may electrically connect the lower source/drain region 326L, instead of the upper source/drain region 326U, to the conductive wire 32.

In some embodiments, the integrated circuit devices 210 and 310 may include the power rail 52' illustrated in FIG. 15, and the conductive plug 18 and the etch stop layer 15 may be omitted from the integrated circuit devices 210 and 310.

Example embodiments are described herein with reference to the accompanying drawings. Many different forms and embodiments are possible without deviating from the scope of the present invention. Accordingly, the present invention should not be construed as limited to the example embodiments set forth herein. Rather, these example embodiments are provided so that this disclosure will be thorough and complete and will convey the scope of the present invention to those skilled in the art. In the drawings, the sizes and relative sizes of layers and regions may be exaggerated for clarity. Like reference numbers refer to like elements throughout.

Example embodiments of the present invention are described herein with reference to cross-sectional views that are schematic illustrations of idealized embodiments and intermediate structures of example embodiments. As such, variations from the shapes of the illustrations as a result, for example, of manufacturing techniques and/or tolerances, are to be expected. Thus, example embodiments of the present invention should not be construed as limited to the particular shapes illustrated herein but include deviations in shapes that result, for example, from manufacturing, unless the context clearly indicates otherwise.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of the stated features, steps, operations, elements and/or components, but do not preclude the presence or addition of one or more other features, steps, operations, elements, components and/or groups thereof. As used herein the term "and/or" includes any and all combinations of one or more of the associated listed items.

It will be understood that although the terms first, second, etc. may be used herein to describe various elements, these elements should not be limited by these terms. These terms are only used to distinguish one element from another. Thus, a first element could be termed a second element without departing from the scope of the present invention.

The above-disclosed subject matter is to be considered illustrative, and not restrictive, and the appended claims are intended to cover all such modifications, enhancements, and other embodiments, which fall within the scope of the invention. Thus, to the maximum extent allowed by law, the scope is to be determined by the broadest permissible interpretation of the following claims and their equivalents and shall not be restricted or limited by the foregoing detailed description.

What is claimed is:

1. A method of forming an integrated circuit device, the method comprising:
    forming a transistor on a first surface of a substrate, wherein the transistor comprises an active region, a source/drain region contacting the active region and a gate electrode on the active region;
    forming an etch stop layer contacting the first surface of the substrate;
    forming a conductive wire that is electrically connected to the source/drain region;
    forming a trench extending through the substrate by etching a second surface of the substrate, wherein the second surface of the substrate is opposite the first surface of the substrate; and
    forming a power rail in the trench, wherein the power rail is electrically connected to conductive wire.

2. The method of claim 1, further comprising:
    forming an insulating layer on the substrate and the etch stop layer before forming the conductive wire; and
    forming a conductive plug in the insulating layer, wherein the conducive plug is electrically connected to the conductive wire.

3. The method of claim 2,
    wherein forming the conductive plug comprises:
        forming an opening that extends through the insulating layer and the etch stop layer and exposes the substrate; and
        forming the conductive plug in the opening.

4. The method of claim 2, wherein the trench exposes the conductive plug, before forming the power rail, and the power rail contacts the conductive plug.

5. The method of claim 1, further comprising forming an insulating layer on the substrate before forming the conductive wire,
    wherein forming the trench further comprises etching the insulating layer until the conductive wire is exposed, and the power rail contacts the conductive wire.

6. The method of claim 1, further comprising forming a back-end metal structure on the conductive wire before forming the trench.

7. The method of claim 1, further comprising exposing the second surface of the substrate by removing a portion of the substrate before forming the trench.

8. The method of claim 1, wherein the substrate is a portion of a substrate structure that further comprises a substrate insulating layer that contacts the second surface of the substrate, and
    the method further comprises exposing the second surface of the substrate by removing the substrate insulating layer before forming the trench.

9. The method of claim 1, wherein a thickness of the substrate is in a range of 50 nm to 100 nm.

10. The method of claim 1, further comprising forming a power delivery network structure on the power rail, wherein the power delivery network structure is electrically connected to the power rail.

11. A method of forming an integrated circuit device, the method comprising:
- forming a transistor on a first surface of a substrate, wherein the transistor comprises an active region, a source/drain region contacting the active region and a gate electrode on the active region;
- forming an etch stop layer contacting the first surface of the substrate;
- forming an insulating layer on the etch stop layer;
- forming an opening that extends through the insulating layer and the etch stop layer and exposes the substrate;
- forming a conductive plug in the opening;
- forming a conductive wire that is electrically connected to the conductive plug and the source/drain region;
- forming a trench that extends through the substrate by etching a second surface of the substrate and exposing the conductive plug, wherein the second surface of the substrate is opposite the first surface of the substrate; and
- forming a power rail in the trench, wherein the power rail contacts the conductive plug.

12. The method of claim 11, wherein a thickness of the substrate is in a range of 50 nm to 100 nm.

13. The method of claim 11, further comprising forming a back-end metal structure on the conductive wire before forming the trench.

14. The method of claim 11, further comprising exposing the second surface of the substrate by removing a portion of the substrate before forming the trench.

* * * * *